(12) United States Patent
Pang et al.

(10) Patent No.: US 11,381,248 B2
(45) Date of Patent: Jul. 5, 2022

(54) PHASE DETECTION METHOD AND APPARATUS, STORAGE MEDIUM AND ELECTRONIC APPARATUS

(71) Applicant: ZTE Corporation, Shenzhen (CN)

(72) Inventors: Rui Pang, Shenzhen (CN); Boming Wang, Shenzhen (CN); Qin Yang, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 0 days.

(21) Appl. No.: 17/292,475

(22) PCT Filed: Feb. 21, 2019

(86) PCT No.: PCT/CN2019/075658
§ 371 (c)(1),
(2) Date: May 10, 2021

(87) PCT Pub. No.: WO2020/073574
PCT Pub. Date: Apr. 16, 2020

(65) Prior Publication Data
US 2022/0069828 A1    Mar. 3, 2022

(30) Foreign Application Priority Data

Oct. 8, 2018  (CN) .......................... 201811168098.6

(51) Int. Cl.
*H03L 7/091*  (2006.01)
*G01R 25/00*  (2006.01)
*H04B 7/0413*  (2017.01)

(52) U.S. Cl.
CPC .............. *H03L 7/091* (2013.01); *G01R 25/00* (2013.01); *H04B 7/0413* (2013.01)

(58) Field of Classification Search
CPC ........ H03L 7/091; G01R 25/00; H04B 7/0413
See application file for complete search history.

(56) References Cited

U.S. PATENT DOCUMENTS 6,269,135 B1   7/2001  Sander
6,441,601 B1   8/2002  Clark
(Continued)

FOREIGN PATENT DOCUMENTS

CN        102135568 A    7/2011
FR         3042877 A1    4/2017
(Continued)

OTHER PUBLICATIONS

International Search Report for corresponding application PCT/CN2019/075658 filed Feb. 21, 2019; dated Jun. 28, 2019.
(Continued)

*Primary Examiner* — Janice N Tieu
(74) *Attorney, Agent, or Firm* — Cantor Colburn LLP

(57) ABSTRACT

A phase detection method and apparatus, and a storage medium and an electronic apparatus are provided. A sampling operation is performed on a clock signal to be detected to obtain binary sequences. Phase intervals of the clock signal to be detected in initial sampling periods are determined, according to the binary sequences, as first phase intervals. Based on a reference phase interval in the first phase intervals, a standardization operation is performed on other phase intervals in the first phase intervals to obtain second phase intervals, wherein the reference phase interval is a phase interval determined within a first sampling period after the sampling operation is triggered, and the other phase intervals are phase intervals determined within sampling periods following the first sampling period. The second phase intervals are converged, and phase information of the clock signal to be detected is obtained according to the converged second phase intervals.

20 Claims, 11 Drawing Sheets

(56) References Cited

U.S. PATENT DOCUMENTS

| | | |
|---|---|---|
| 11,115,178 B1* | 9/2021 | Lou ........................ H03L 7/0807 |
| 2012/0217953 A1 | 8/2012 | Xiangguang |
| 2013/0076412 A1* | 3/2013 | Shirai ...................... H03L 7/091 |
| | | 327/156 |
| 2014/0070862 A1 | 3/2014 | Palmer |
| 2014/0149780 A1* | 5/2014 | Dally ......................... G06F 1/12 |
| | | 713/503 |
| 2021/0184682 A1* | 6/2021 | Tak ........................ H03L 7/0807 |

FOREIGN PATENT DOCUMENTS

| | | |
|---|---|---|
| WO | 9408394 A1 | 4/1994 |
| WO | 9901812 A1 | 1/1999 |

OTHER PUBLICATIONS

Written Opinion for corresponding application PCT/CN2019/075658 filed Feb. 21, 2019; dated Jun. 28, 2019.

* cited by examiner

PHASE DETECTION METHOD AND APPARATUS, STORAGE MEDIUM AND ELECTRONIC APPARATUS

CROSS REFERENCE

This application is a National Stage Filing of the PCT International Application No. PCT/CN2019/075658 filed on Feb. 21, 2019, which claims priority to Chinese Application No. 201811168098.6 filed on Oct. 8, 2018, the entirety of which is herein incorporated by reference.

TECHNICAL FIELD

The present disclosure relates to the field of communications, and in particular to a phase detection method and apparatus, a storage medium and an electronic apparatus.

BACKGROUND

The Massive Multiple In Multiple Out (MIMO) technology in a multi-array antenna base station is a key technology in 4.5G and 5G communications. In 5G communications, Space Division Multiple Access (SDMA) is an important example of application of the Massive MIMO technology. The SDMA uses a beamforming technology to concentrate signal energy in a specific direction for transmission, thus increasing spectrum utilization efficiency and reducing interference to other receivers. Beamforming has a strict requirement for the phase difference of signals among multiple channels of transceivers. For example, the phase difference among multiple channels of the transceivers in a 5G base station of sub 6G is required to be less than 5°. Therefore, a wireless base station system adopts a series of phase detection and adjustment measures to reduce a phase error between channels and align the phases of signals of multiple channels.

In a phase synchronization mechanism, phase detection of a Radio Frequency (RF) clock signal is the most important operation, and the phase detection precision directly affects the effect of multi-channel synchronization. At present, there is not a proper high-precision phase detection scheme for the RF clock signal. In addition, there is not a proper high-precision phase detection scheme for other types of clock signals.

For the above problem existing in related technologies, no effective solution has been put forward.

SUMMARY

Embodiments of the present disclosure provide a phase detection method and apparatus, a storage medium and an electronic apparatus, which may at least solve the problem in related technologies of low phase detection precision of a clock signal.

According to an embodiment of the present disclosure, a phase detection method is provided, which include the following operations. A sampling operation is performed on a clock signal to be detected to obtain binary sequences. Phase intervals of the clock signal to be detected in initial sampling periods are determined, according to the binary sequences, as first phase intervals. Based on a reference phase interval in the first phase intervals, a standardization operation is performed on other phase intervals in the first phase intervals to obtain second phase intervals, wherein the reference phase interval is a phase interval determined within a first sampling period after the sampling operation is triggered, and the other phase intervals are phase intervals determined within sampling periods following the first sampling period after the sampling operation is triggered. The second phase intervals are converged, and phase information of the clock signal to be detected is obtained according to the converged second phase intervals.

According to another embodiment of the present disclosure, a phase detection apparatus is also provided, which may include a sampling module, a phase interval determining module, a standardization module and a phase interval converging module. The sampling module is configured to perform a sampling operation on a clock signal to be detected to obtain binary sequences. The phase interval determining module is configured to determine, according to the binary sequences, phase intervals of the clock signal to be detected in initial sampling periods as first phase intervals. The standardization module is configured to perform, based on a reference phase interval in the first phase intervals, a standardization operation on other phase intervals in the first phase intervals to obtain second phase intervals, wherein the reference phase interval is a phase interval determined within a first sampling period after the sampling operation is triggered, and the other phase intervals are phase intervals determined within sampling periods following the first sampling period after the sampling operation is triggered. The phase interval converging module is configured to converge the second phase intervals, and obtain, according to the converged second phase intervals, phase information of the clock signal to be detected.

According to yet another embodiment of the present disclosure, a storage medium is also provided. The storage medium stores a computer program. The computer program is configured to perform, at runtime, operations in any of the above method embodiments.

According to yet another embodiment of the present disclosure, an electronic apparatus is also provided, which includes a memory and a processor. The memory stores a computer program. The processor is configured to run the computer program to perform operations in any of the above method embodiments.

In the embodiments of the present disclosure, a series of binary sequences are obtained by sampling a clock signal to be detected, and based on these pieces of digital sampling information, a phase interval of the clock signal to be detected is determined in each sampling period, and finally, phase information of the clock signal to be detected is converged through a series of phase interval standardization operations. The scheme in the embodiments of the present disclosure can simplify the phase detection algorithm, can be easily implemented in a related circuit, and can achieve fast phase convergence and high phase detection precision.

BRIEF DESCRIPTION OF THE DRAWINGS

The accompanying drawings described herein are used to provide a deeper understanding of the present disclosure, and constitute a part of the present application. The exemplary embodiments of the present disclosure and the description thereof are used to explain the present disclosure. The drawings and the exemplary embodiment do not constitute limitations to the present disclosure. In the drawings.

DETAILED DESCRIPTION OF THE EMBODIMENTS

Figure 1:
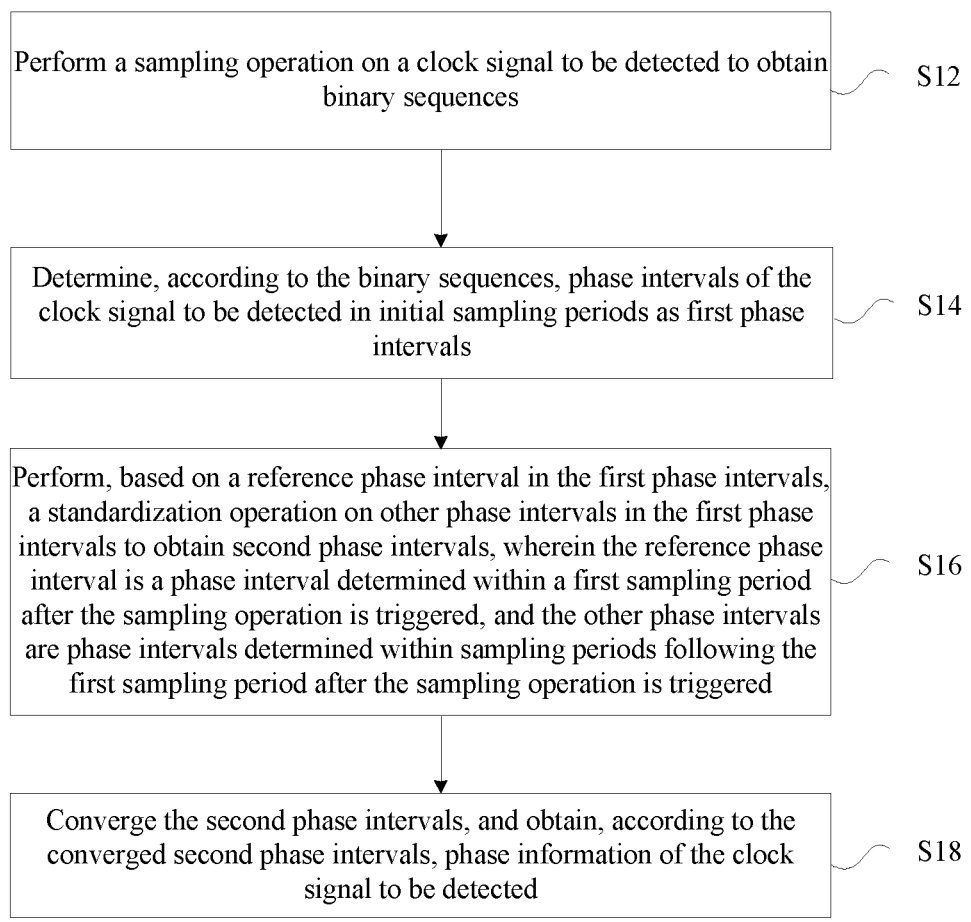
FIG. 1 is a flowchart of a phase detection method according to an embodiment of the present disclosure.

The present disclosure is described below in detail with reference to the drawings and in conjunction with the embodiments. It is to be noted that embodiments in the present application and characteristics in the embodiments may be combined to derive other embodiments not explicitly described.

It is to be noted that the terms "first", "second" and the like in the specification, the claims and the drawings of the present disclosure are used to distinguish similar objects, and are not used to describe a specific sequence or a precedence order.

First of all, how to carry out phase detection in the related technologies is explained as follows.

In the related technologies, a Phase and Frequency Detector (PFD) is a common circuit used to identify the frequency and phase difference of two input clock signals. In general, the PFD consists of two D flip-flops and a NAND gate. The D trigger outputs a high level after receiving the rising edge of an input clock, and resets after the output of both D flip-flops reaches a high level. In this way, the PFD can output a pulse signal that represents the frequency or phase difference of two input clock signals. However, the application of the PFD to the phase detection in transceiver channels or other scenarios will have the following difficulties and problems.

First, PFD phase detection will greatly increase the complexity of the original system. In an MIMO system which needs phase detection, the number of transceiver channels has reached dozens or even hundreds, and according to the characteristics of the PFD in identifying a two-pathway signal, an equal number of PFDs will be used. Moreover, the MIMO system generally consists of multiple chips, and the wiring between chips and the PFDs will make the PCB layout very complex, and will reduce the reliability of circuit.

Second, the PFD cannot directly give or it is difficult for the PFD to give phase information of the input clock signal. The PFD represents the frequency or phase difference of two input clock signals as a pulse signal with a certain width, rather than a series of high and low levels or binary sequences, so it is difficult for a post-stage digital circuit to convert the pulse signal into pure phase information. In a scenario where a phase value needs to be directly detected, the PFD cannot meet application requirements.

Finally, in a wireless communication scenario, the frequency and phase detection ability of the PFD is greatly challenged. With the increasing shortage of spectrum resources and the dramatic increase in the amount of data transmitted, the communication technology is constantly evolving, and the frequency band of wireless communication is developing towards high frequency and large bandwidth. For the Sub 6G low frequency band in 5G NR, the frequency and phase detection ability of the PFD is already too limited, let alone the 5G high frequency band as high as 24.25-29.5 GHz. Moreover, such high-frequency clock signals are no longer simple square waves or quasi-square waves, and after receiving these signals, the PFD is no longer able to properly or reliably show its frequency and phase detection ability.

For the above problems of phase detection using the PFD in the related technologies, some solutions are also proposed in the industry.

For example, a phase detection method applicable to the field of wireless communications is proposed in a patent in the United States, but it is to be noted that there are the following deficiencies in the patent:

a Numerically Controlled Oscillator (NCO) and digital circuit modules for achieving an arctangent function are used in the above patent, and the precision of these digital circuit modules is limited; if the number of computing iterations is small, the phase detection precision will be greatly limited, and if the number of iterations is large, the phase detection precision can be improved to a certain extent, but the cost of computing resources will be significantly increased.

It can be seen that the solutions proposed in the related technologies actually cannot effectively solve the problem of low phase detection precision of the clock signal. In order to effectively solve the problem of low phase detection precision of the clock signal in the related technologies, a phase detection method and apparatus, a storage medium and an electronic apparatus are provided in the embodiments of the present disclosure. The present disclosure is illustrated below in combination with the embodiments.

A phase detection method is provided in an embodiment. FIG. 1 is a flowchart of a phase detection method according to an embodiment of the present disclosure. As shown in FIG. 1, the flow may include the following operations.

At S12, a sampling operation is performed on a clock signal to be detected to obtain binary sequences.

At S14, phase intervals of the clock signal to be detected in initial sampling periods are determined, according to the binary sequences, as first phase intervals.

At S16, based on a reference phase interval in the first phase intervals, a standardization operation is performed on other phase intervals in the first phase intervals to obtain second phase intervals, wherein the reference phase interval is a phase interval determined within a first sampling period after the sampling operation is triggered, and the other phase intervals are phase intervals determined within sampling periods following the first sampling period after the sampling operation is triggered.

At S18, the second phase intervals are converged, and phase information of the clock signal to be detected is obtained according to the converged second phase intervals.

The above operations may be performed by a phase detection apparatus. In the above embodiment, each obtained binary sequence may be a discrete binary sequence.

In the above embodiment, a series of binary sequences can be obtained by sampling a clock signal to be detected, and based on these pieces of digital sampling information, a phase interval of the clock signal to be detected is determined in each sampling period, and finally, phase information of the clock signal to be detected is converged through a series of phase interval standardization operations.

In the embodiments of the present disclosure, there is no need to carry out too many computing iterations, so there will be no additional computing resource overhead. Moreover, it is to be noted that after experimental verification, the scheme in the embodiments of the present disclosure can ensure the phase detection precision without too many computing iterations. Compared with the problem in the related technologies that when the number of computing iterations is small, the phase detection precision will be greatly limited, and when the number of computing iterations is large, the computing resource overhead will be increased, the scheme in the embodiments of the present disclosure can ensure the phase detection precision on the premise of reducing the number of computing iterations.

In addition, it is also to be noted that the related patent mentioned above involves complex matrix multiplication and complex conjugate operation, which is not conducive to reducing the circuit scale and power consumption of the application system due to the complexity of the algorithm. Moreover, in the patent mentioned above, two input signals to be detected are required to be orthogonal, so only phase detection of orthogonal signals can be realized by virtue of the scheme of the patent mentioned above. However, in the embodiments of the present disclosure, overly complex matrix multiplication and complex conjugate operation are not involved, so the circuit scale as well as the power consumption of the application system can be effectively reduced.

Therefore, the scheme in the embodiments of the present disclosure can simplify the phase detection algorithm, can be easily implemented in a related circuit, and can achieve fast phase convergence and high phase detection precision. The scheme in the above embodiment of the present disclosure is further explained below in combination with other embodiments.

In an exemplary embodiment, the operation that the sampling operation is performed on the clock signal to be detected to obtain the binary sequences may be implemented in the following manner. The sampling operation is performed, based on a sampling clock signal, on the clock signal to be detected to obtain the binary sequences. In the exemplary embodiment, a lowest common multiple of a frequency of the sampling clock signal and a frequency of the clock signal to be detected exceeds a predetermined threshold. In the exemplary embodiment, in order to ensure the diversity of sampling, the frequency of the sampling clock signal should be selected reasonably, so that the frequency of the clock signal to be detected and the frequency of the sampling clock signal should have a larger lowest common multiple.

In an exemplary embodiment, the operation that the phase intervals of the clock signal to be detected in the initial sampling periods are determined, according to the binary sequences, as the first phase intervals may be implemented in the following manner. The phase intervals of the clock signal to be detected at respective rising edges of the sampling clock signal are determined according to the binary sequences. Intervals of the clock signal to be detected at initial sampling moments are determined, according to the determined phase intervals and cumulative phase differences of the clock signal to be detected relative to the sampling clock signal, as the first phase intervals, In the embodiments, the sampling clock signal is used for performing the sampling operation on the clock signal to be detected.

In an exemplary embodiment, the operation that the phase intervals of the clock signal to be detected at respective rising edges of the sampling clock signal are determined according to the binary sequences may be implemented in the following manner. A phase interval determination condition corresponding to a type of the binary sequences is determined. The phase intervals of the clock signal to be detected at the respective rising edges of the sampling clock signal are determined according to the binary sequences and the phase interval determination condition.

In an exemplary embodiment, the type of the binary sequences includes at least one of: a differential type, a single-ended type, and an orthogonal type. In the above embodiments, according to the types of the obtained binary sequences (that is, differential, single-ended or orthogonal), the configuration of the phase interval determination condition is different. According to the requirement of fast sampling or high reliability sampling, the configuration of the phase interval determination condition may also be different.

In an exemplary embodiment, the operation that based on the reference phase interval in the first phase intervals, the standardization operation is performed on the other phase intervals in the first phase intervals to obtain the second phase intervals may be implemented in the following manner. Using the reference phase interval as a standard, the other phase intervals are transferred to a phase period in which the reference phase interval falls to obtain the second phase intervals.

In an exemplary embodiment, the operation that using the reference phase interval as the standard, the other phase intervals are transferred to the phase period in which the reference phase interval falls to obtain the second phase intervals may be implemented in the following manner. In a case of determining that there is no intersection between the other phase intervals and the reference phase interval, the other phase intervals are repeatedly inversed until the other phase intervals intersect with the reference phase interval.

The reference phase interval and the other phase intervals after the inversion are determined as the second phase intervals.

In an exemplary embodiment, the inversion includes shifting left by $2\pi$ or shifting right by $2\pi$.

In an exemplary embodiment, after the phase intervals of the clock signal to be detected in the initial sampling periods are determined, according to the binary sequences, as the first phase intervals, the method may further include the following operation. In a case of determining that there is an intersection between the other phase intervals and the reference phase interval, the first phase intervals are directly converged without performing the standardization operation on the other phase intervals, and the phase information of the clock signal to be detected is obtained according to the converged first phase intervals.

In an exemplary embodiment, after the standardization operation is performed, based on the reference phase interval in the first phase intervals, on the other phase intervals in the first phase intervals to obtain the second phase intervals, the method may further include the following operations. An intersection of the second phase intervals in a current sampling period is obtained in turn until a difference between an upper limit and a lower limit of the intersection of the second phase intervals in the current sampling period is less than a predetermined value, wherein the intersection of the second phase intervals in the current sampling period is obtained by intersecting a phase interval, which corresponds to the current sampling period, among the second phase intervals with the intersection of the second phase intervals in a previous sampling period. The operation that the second phase intervals are converged, and the phase information of the clock signal to be detected is obtained according to the converged second phase intervals may be implemented in the following manner. An initial phase of the clock signal to be detected at an initial sampling moment is obtained by averaging the upper limit and the lower limit, the difference between which is less than the predetermined value. A phase of the clock signal to be detected in the current sampling period is obtained by summing the initial phase and a phase difference, wherein the phase difference is a cumulative phase difference, for the current sampling period, of the clock signal to be detected relative to the sampling clock signal, and the cumulative phase difference is calculated according to a relationship between a frequency of the clock signal to be detected and a frequency of the sampling clock signal used for performing the sampling operation. In the present embodiment, according to the number of sampling periods experienced and the relationship between the frequency of the clock signal to be detected and the frequency of the sampling clock signal, the phase difference between the clock signal to be detected and the sampling clock signal since triggering the sampling operation may be calculated by means of an adder or a multiplier.

Through the description of the above implementations, those having ordinary skill in the art can understand that the method according to the above embodiment may be implemented by means of software plus a necessary general hardware platform, and of course, may also be implemented through hardware, but in many cases, the former is a better implementation. Based on such understanding, the essence of technical solution of the embodiments of the present disclosure, or in other words, the part of the technical solutions making contributions to the conventional art, may be embodied in the form of a software product stored in a storage medium (such as a Read-Only Memory (ROM)/ Random Access Memory (RAM), a magnetic disk and an optical disc), including a number of instructions for enabling a terminal device (which may be a mobile phone, a computer, a server, or a network device, etc.) to perform the methods described in various embodiments of the present disclosure.

A phase detection apparatus is also provided in the embodiments. The apparatus is used to implement the above embodiments and exemplary implementations, and the details having been described will not be repeated. As used below, the term "module" may implement a combination of software and/or hardware of a predetermined function. Although the apparatus described in the following embodiments is preferably implemented in software, the implementation in hardware or a combination of software and hardware is also possible and contemplated.

Figure 2:
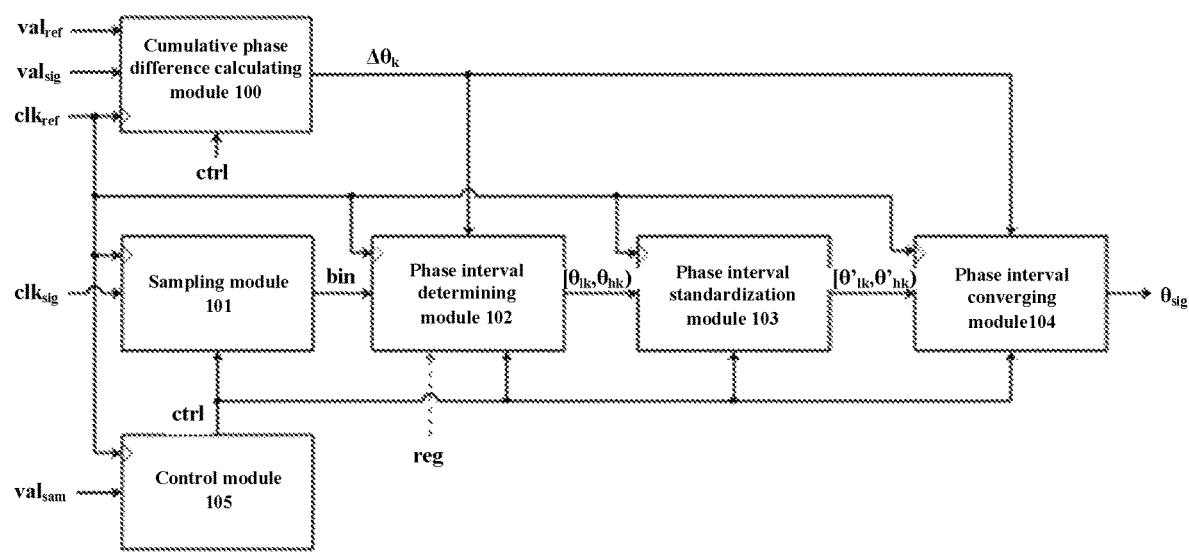
FIG. 2 is a structural block diagram of a phase detection apparatus according to an embodiment of the present disclosure.

FIG. 2 is a structural block diagram of a phase detection apparatus according to an embodiment of the present disclosure. As shown in FIG. 2, the apparatus may include: a sampling module 101, a phase interval determining module 102, a standardization module 103 and a phase interval converging module 104.

The sampling module 101 is configured to perform a sampling operation on a clock signal to be detected to obtain binary sequences. The phase interval determining module 102 is configured to determine, according to the binary sequences, phase intervals of the clock signal to be detected in initial sampling periods as first phase intervals. The standardization module 103 (which may also be called a phase interval standardization module 103) is configured to perform, based on a reference phase interval in the first phase intervals, a standardization operation on other phase intervals in the first phase intervals to obtain second phase intervals, wherein the reference phase interval is a phase interval determined within a first sampling period after the sampling operation is triggered, and the other phase intervals are phase intervals determined within sampling periods following the first sampling period after the sampling operation is triggered. The phase interval converging module 104 is configured to converge the second phase intervals, and obtain, according to the converged second phase intervals, phase information of the clock signal to be detected.

In addition, it is also to be noted that except the above modules, the structural block diagram shown in FIG. 2 may further include a cumulative phase difference calculating module 100 and a control module 105. FIG. 2 shows the above six modules, and the connection relationship among these modules can refer to FIG. 2. Parameters in FIG. 2 will be described in detail in the following embodiments.

In the above embodiment, the cumulative phase difference calculating module 100 may calculate, by means of an adder or a multiplier, the phase difference between the clock signal to be detected and the sampling clock signal since the triggering of the sampling operation according to the number of sampling periods experienced and the frequency relationship between the clock signal to be detected and the sampling clock signal.

The input $clk_{sig}$ of the sampling module 101 may be square wave or quasi-square wave of the differential, single-ended or orthogonal type, or may be sinusoidal signals, and the output is binary sequences of the corresponding form. The sampling module 101 may consist of a core sampler (which may also be called a sampler for short) and a post-stage waveform shaper to convert input analog amplitude information into a discrete digital signal (that is, binary sequences). The core sampler may be realized by flip-flops of True Single Phase Clock (TSPC) or Current Mode Logic (CML) or other forms. The post-stage waveform shaper may be realized by a Schmidt trigger or an inverter circuit, and is configured to amplify the signal amplitude and shape the waveform. The sampler may be differential, single-ended or orthogonal according to the type of the clock signal to be detected. According to the requirement for the phase detection precision, a sampling clock signal of a certain frequency may be selected to reduce the frequency correlation between the clock signal to be detected and the sampling clock signal, that is, to increase the lowest common multiple of the frequency of the clock signal to be detected and the frequency of the sampling clock signal. In some exemplary implementations, the sampling module may include a sampler, configured to perform, based on a sampling clock signal, the sampling operation on the clock signal to be detected to obtain the binary sequences, wherein a lowest common multiple of the frequency of the sampling clock signal and the frequency of the clock signal to be detected exceeds a predetermined threshold.

The phase interval determining module 102 may determine, according to the binary sequences output by the sampling module 101, the phase intervals of the clock signal to be detected at respective rising edges of the sampling clock signal, and determine, according to a phase relationship between the sampling clock signal and the clock signal to be detected, the phase intervals of the clock signal to be detected at initial sampling moments. In some exemplary implementations, the phase interval determining module 102 may include a phase interval determiner and an adder. The phase interval determiner is configured to determine, according to the binary sequences, the phase intervals of the clock signal to be detected at respective rising edges of the sampling clock signal. The adder is configured to determine, according to the determined phase intervals and cumulative phase differences of the clock signal to be detected relative to the sampling clock signal, intervals of the clock signal to be detected at initial sampling moments as the first phase intervals, wherein the sampling clock signal is used for performing the sampling operation on the clock signal to be detected. The phase interval determining module 102 will be described in detail later.

The phase interval determiner may determine a phase interval determination condition corresponding to a type of the binary sequences, and determine the phase intervals of the clock signal to be detected at the respective rising edges of the sampling clock signal according to the binary sequences and the phase interval determination condition. In the present embodiment, according to the difference of the types of the binary sequences (that is, differential, single-ended or orthogonal) output by the sampling module 101, the configuration of the phase interval determination condition may be different. According to the requirement for fast sampling or high-reliability sampling, the configuration of the phase interval determination condition may also be different.

The standardization module 103 may be configured to transfer, using the reference phase interval as a standard, the other phase intervals to a phase period in which the reference phase interval falls to obtain the second phase intervals. In some exemplary implementations, the standardization module 103 may include a phase scaler. The phase scaler is configured to, in a case of determining that there is no intersection between the other phase intervals and the reference phase interval, repeatedly inverse the other phase intervals until the other phase intervals intersect with the reference phase interval, and determine the reference phase interval and the other phase intervals after the inversion as the second phase intervals. In some exemplary implementations, the inversion includes shifting left by $2\pi$ or shifting right by $2\pi$.

In an exemplary embodiment, the apparatus is further configured to: after the phase interval determining module determines, according to the binary sequences, the phase intervals of the clock signal to be detected in the initial sampling periods as the first phase intervals, in a case of determining that there is an intersection between the other phase intervals and the reference phase interval, directly converge the first phase intervals without performing the standardization operation on the other phase intervals, and obtain the phase information of the clock signal to be detected according to the converged first phase intervals.

In an exemplary embodiment, the phase interval converging module 104 may include an interval intersection obtaining module, an averaging module and an adder. The interval intersection obtaining module, configured to, after the standardization module performs, based on the reference phase interval in the first phase intervals, the standardization operation on the other phase intervals in the first phase intervals to obtain the second phase intervals, obtain an intersection of the second phase intervals in a current sampling period in turn until a difference between an upper limit and a lower limit of the intersection of the second phase intervals in the current sampling period is less than a predetermined value. Herein, the intersection of the second phase intervals in the current sampling period is obtained by intersecting a phase interval, which corresponds to the current sampling period, among the second phase intervals with the intersection of the second phase intervals in a previous sampling period. The averaging module is configured to obtain an initial phase of the clock signal to be detected at an initial sampling moment by averaging the upper limit and the lower limit, the difference between which is less than the predetermined value. The adder is configured to obtain a phase of the clock signal to be detected in the current sampling period by summing the initial phase and a phase difference. Herein, the phase difference is a cumulative phase difference, for the current sampling period, of the clock signal to be detected relative to the sampling clock signal, and the cumulative phase difference is calculated according to a relationship between a frequency of the clock signal to be detected and a frequency of the sampling clock signal used for performing the sampling operation. It can thus be seen that the phase interval converging module 104 is configured to obtain the intersection of the phase intervals output by the phase interval standardized module 103. The module 104 may consist of a simple comparator, which updates an intersection phase interval of the current sampling period by comparing the upper and lower limits of the input phase interval of the current sampling period and the upper and lower limits of the intersection phase interval of the previous sampling period. By using an averaging module, the phase interval converging module can directly output a phase value of the clock signal to be detected at the initial sampling moment. Based on this phase value, the phase value of the current sampling clock signal can be obtained by adding the phase difference between the current clock signal to be detected and the sampling clock signal.

In an exemplary embodiment, the control module 105 is configured to control various modules in the phase detection apparatus in the embodiments of the present disclosure. The control module 105 can configure the number of sampling periods, and realize functions of triggering or terminating a phase detection operation and resetting a phase process. By reasonably configuring the frequency of the sampling clock signal and the number of sampling periods, the phase detection scheme in the embodiments of the present disclosure may achieve high precision.

The above modules and the specific components included in the modules are described below in combination with the accompanying drawings.

Figure 3:
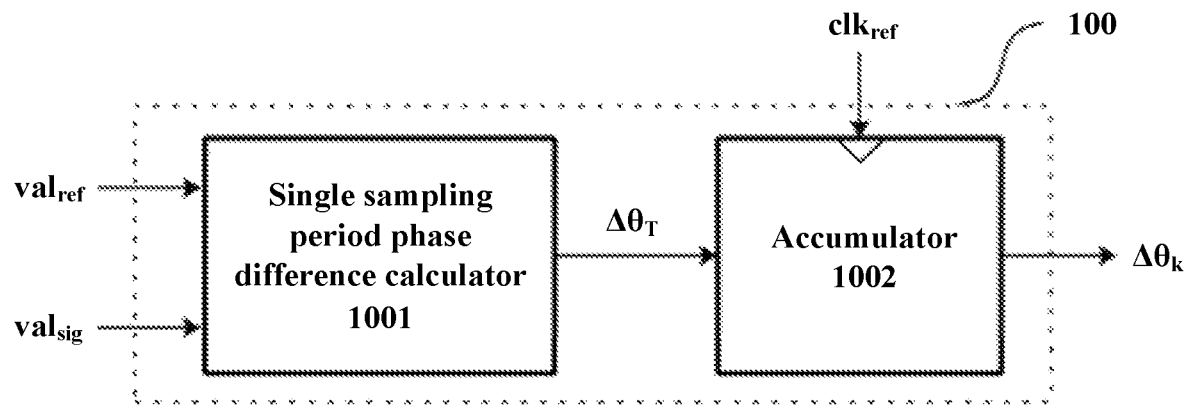
FIG. 3 is a structure diagram of a cumulative phase difference calculating module 100 according to an embodiment of the present disclosure.

FIG. 3 is a structure diagram of a cumulative phase difference calculating module 100. As shown in FIG. 3, the cumulative phase difference calculating module 100 may include a single sampling period phase difference calculator 1001 and an accumulator 1002. The single sampling period phase difference calculator 1001 calculates the phase difference $\theta_T$ between the clock signal to be detected and the sampling clock signal in a single sampling period according to the relationship between the frequency $val_{ref}$ of the sampling clock signal and the frequency $val_{sig}$ of the clock signal to be detected, where $\theta_T = 2\pi \cdot mod(val_{sig}/val_{ref})$. The accumulator 1002 accumulates the phase difference $\Delta\theta_k$ between the clock signal to be detected and the sampling clock signal after k sampling periods, where $\Delta\theta_k = K \cdot \theta_T$.

Figure 4:
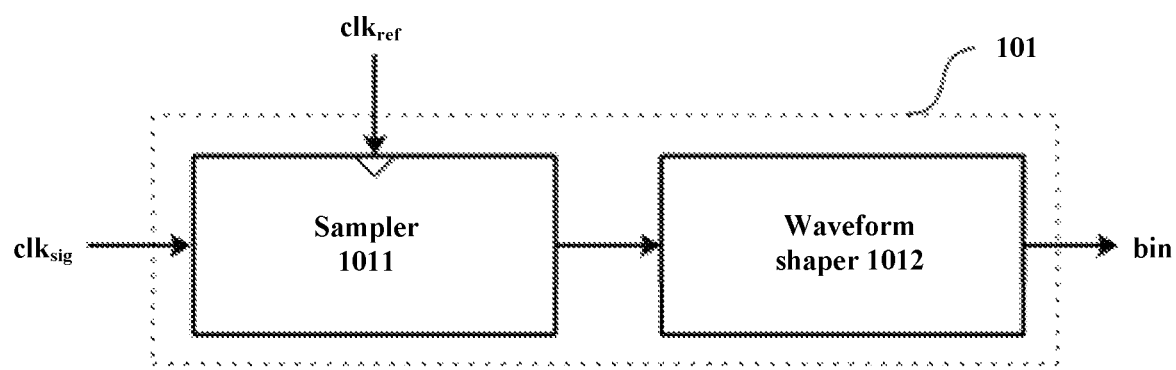
FIG. 4 is a schematic diagram of a sampling module 101 according to an embodiment of the present disclosure.

FIG. 4 is a structure diagram of the sampling module 101. As shown in FIG. 4, the sampling module 101 samples the clock signal to be detected under the sampling clock signal, and converts analog amplitude information $clk_{sig}$ into a discrete digital signal bin. The sampling module 101 may include a sampler 1011 and a waveform shaper 1012.

Figure 8:
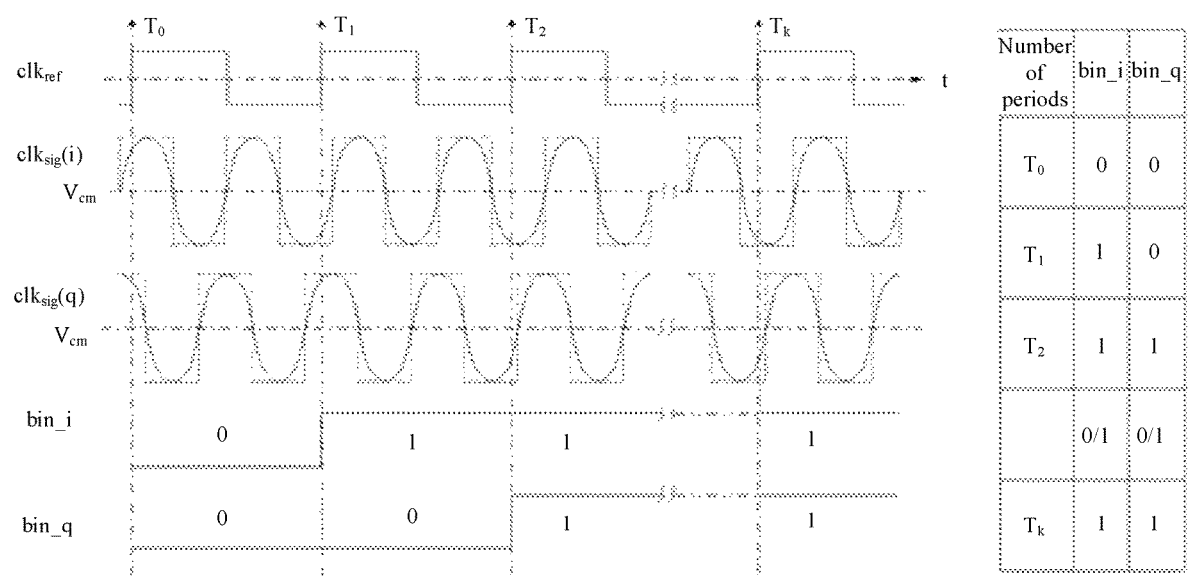
FIG. 8 is a functional schematic diagram of a sampling module 101 according to an embodiment of the present disclosure.
Figure 9:
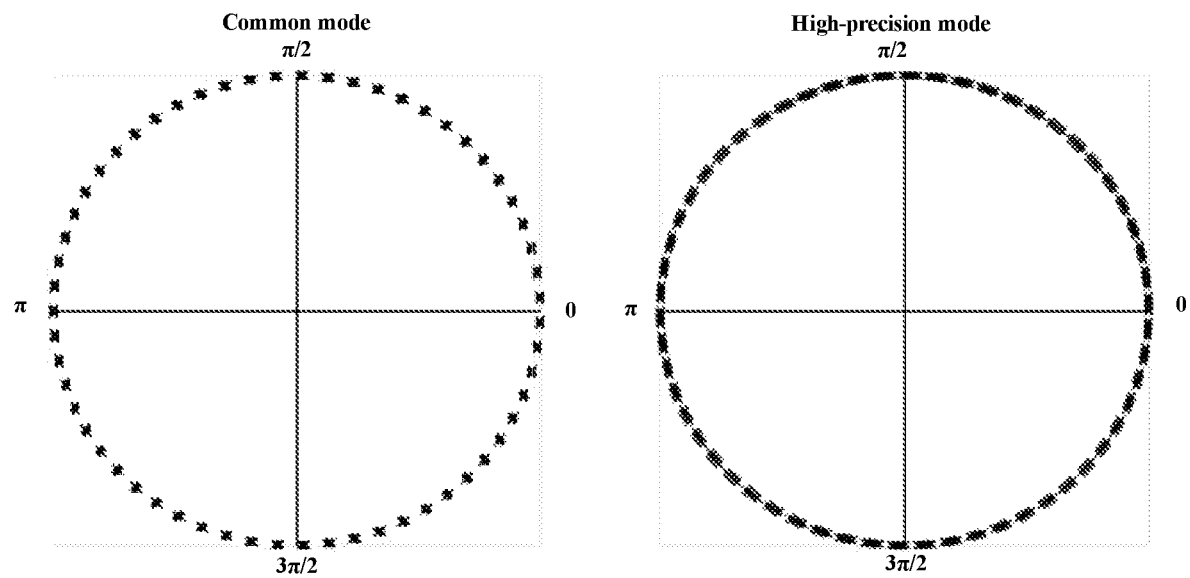
FIG. 9 is a sampling point coverage diagram of a common mode and a high-precision mode according to an embodiment of the present disclosure.
Figure 10:
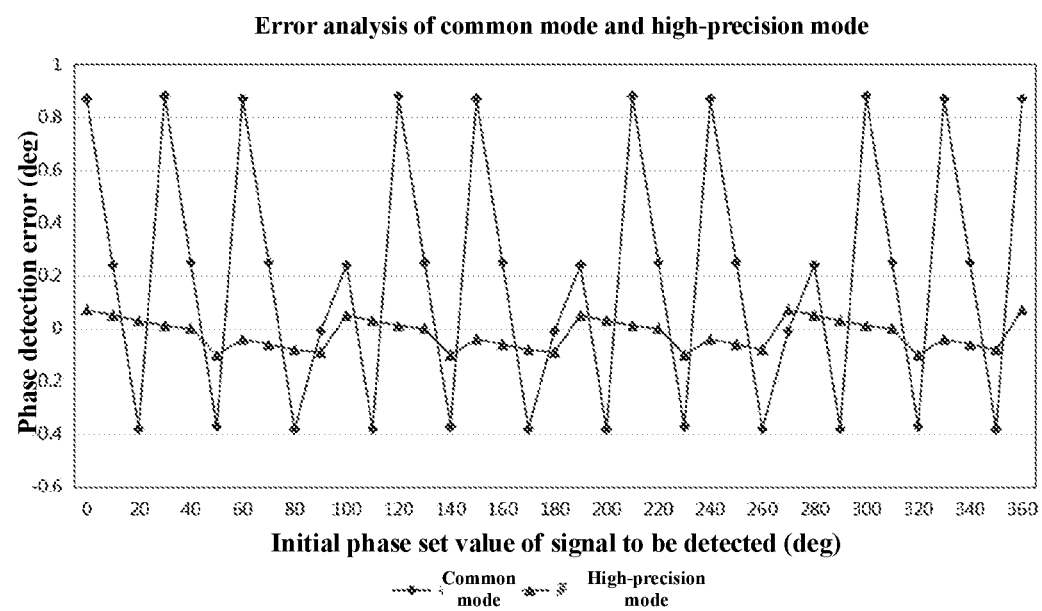
FIG. 10 is an error analysis diagram of a common mode and a high-precision mode according to an embodiment of the present disclosure.

The sampling module 1011 consists of the flip-flops of TSPC or CML or other forms. The waveform shaper 1012 performs amplitude amplification and waveform shaping on the signal output by the sampling module 1011, and outputs an ideal digital pulse signal bin. In the scenario where the clock signal to be detected is of orthogonal form shown in FIG. 8, the sampling module 101 samples the clock signal to be detected at the clock rising edge of each sampling clock signal $clk_{ref}$, outputs 0 if a sampling level is higher than or equal to the common mode level, and outputs 1 if the sampling level is lower than the common mode level. According to the requirement for the phase detection precision, a sampling clock signal of a certain frequency may be selected to reduce the frequency correlation between the clock signal to be detected and the sampling clock signal, that is, to increase the lowest common multiple of the frequency of the clock signal to be detected and the frequency of the sampling clock signal, so as to prevent the sampling from entering a cycle. If the lowest common multiple of the frequency of the clock signal to be detected and the frequency of the sampling clock signal is small, that is, there are smaller integers m and n making $m \cdot val_{sig} = n \cdot val_{ref}$, then binary data output by the sampling module 101 will enter a periodic cycle after n sampling periods, that is, the maximum sampling diversity will be achieved in n sampling periods. As shown in the sampling point coverage diagram and error analysis curve of common mode and high-precision mode in FIG. 9 and FIG. 10, by selecting the sampling clock signal whose frequency has a weak correlation with the frequency of the clock signal to be detected, the sampling points can cover the whole phase interval of $[0,2\pi)$, the diversity of sampling samples can be increased, and the phase detection precision of the whole phase detection scheme can be improved remarkably.

Figure 5:
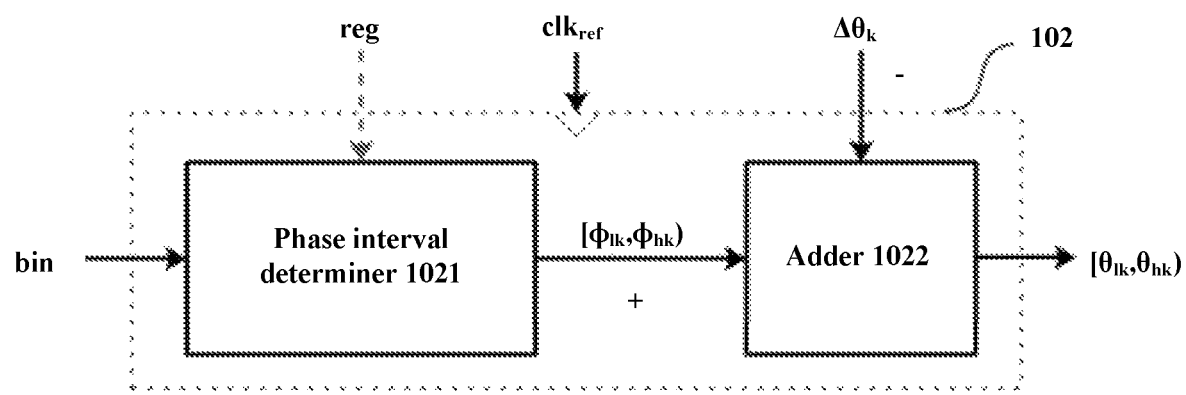
FIG. 5 is a schematic diagram of a phase interval determining module 102 according to an embodiment of the present disclosure.
Figure 11:
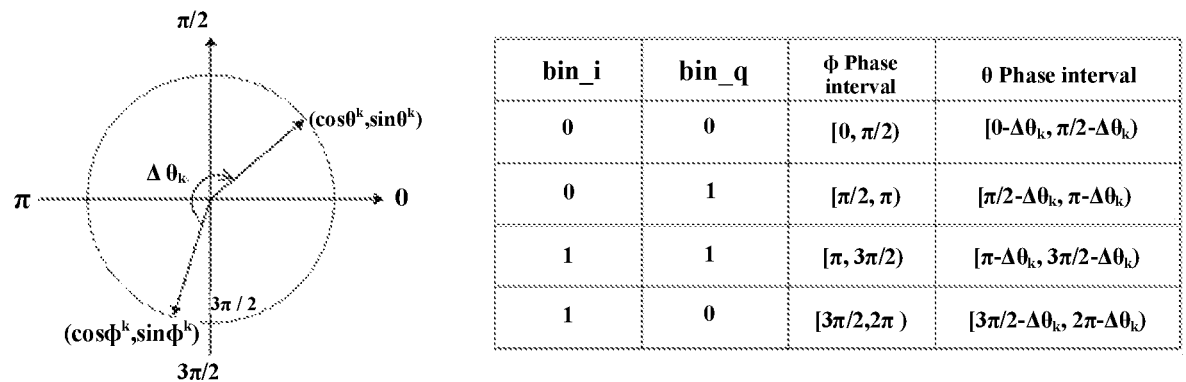
FIG. 11 is a functional schematic diagram of a phase interval determining module 102 according to an embodiment of the present disclosure.

FIG. 5 is a structure diagram of a phase interval determining module 102. As shown in FIG. 5, the phase interval determining module 102 may determine the phase interval of the clock signal to be detected in the current sampling period according to the input binary sequence bin and the determination condition written by reg, and determine the phase interval $[\theta_{lk}, \theta_{hk})$ of the clock signal to be detected at the initial sampling moment according to the cumulative phase difference $\Delta\theta_k$ of the clock signal to be detected relative to the sampling clock signal, where the subscript k is the number of sampling periods experienced. The phase interval determining module 102 may include a phase interval determiner 1021 and an adder 1022. The phase interval determiner 1021 may determine a real-time phase interval $[\varphi_{lk}, \varphi_{hk})$ of the clock signal to be detected according to the input binary sequence bin and the determination condition written by reg. The adder 1022 subtracts the phase difference $\Delta\theta_k$ of the clock signal to be detected relative to the sampling clock signal on the basis of $[\varphi_{lk}, \varphi_{hk})$ to obtain the phase interval $[\theta_{lk}, \theta_{hk})$ of the clock signal to be detected at the initial sampling moment, where $\theta_{lk} = \varphi_{lk} - \Delta\theta_k$, $\theta_{hk} = \varphi_{hk} - \Delta\theta_k$. The determination condition of phase interval may be configured according to the form of the clock signal to be detected (such as single-ended, differential and orthogonal) and the requirements for detection reliability. If the clock signal to be detected is of the orthogonal form, the phase interval determination condition of the phase interval determining module 102 may be configured as shown in FIG. 11.

Figure 6:
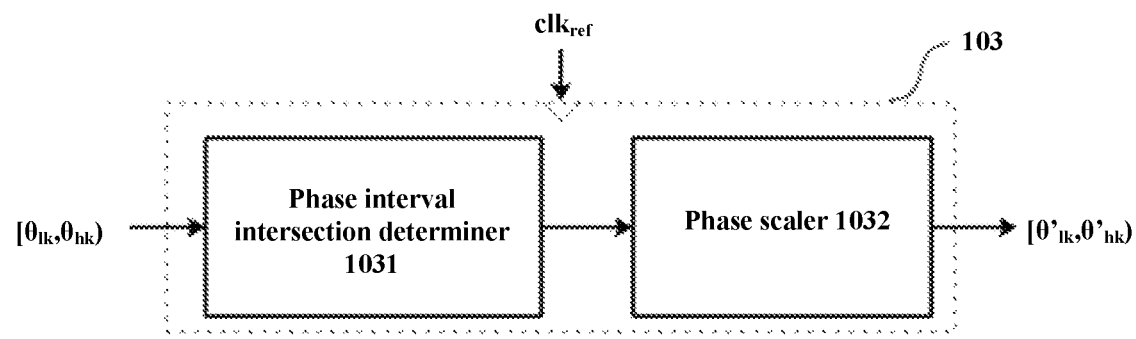
FIG. 6 is a schematic diagram of a phase interval standardization module 103 according to an embodiment of the present disclosure.
Figure 12:
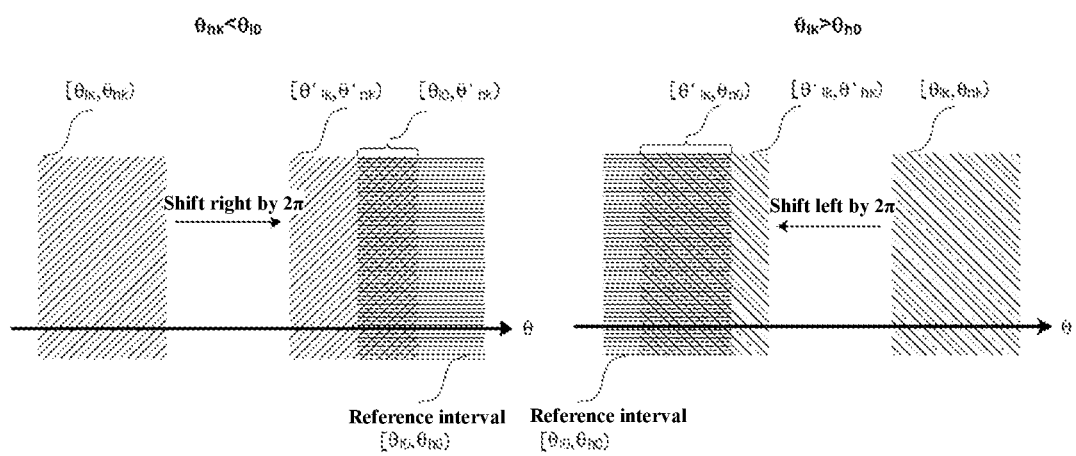
FIG. 12 is a functional schematic diagram of a phase interval standardization module 103 according to an embodiment of the present disclosure.

FIG. 6 is a structure diagram of the standardization module 103. As shown in FIG. 6, the standardization module 103 takes the phase interval $[\theta_{l0}, \theta_{h0})$ determined in the first sampling period after the sampling operation is triggered as the reference interval to judge whether $[\theta_{lk}, \theta_{hk})$ of the subsequent sampling period has an interval intersection with $[\theta_{l0}, \theta_{h0})$. If there is no interval intersection, interval inversion, namely an operation of shifting left or shifting right by $2\pi$, is performed on $[\theta_{lk}, \theta_{hk})$ until the interval intersects with $[\theta_{l0}, \theta_{h0})$. If there is an interval intersection (i.e., overlap), the interval inversion is not performed on $[\theta_{lk}, \theta_{hk})$. The standardization module 103 outputs the phase interval $[\theta'_{lk}, \theta'_{hk})$ after standardized processing. The module may include a phase interval intersection determiner 1031 and a phase scaler 1032. The phase interval intersection determiner 1031 takes the phase interval $[\theta_{l0}, \theta_{h0})$ determined in the first sampling period after the sampling operation is triggered as the reference interval to determine whether $[\theta_{lk}, \theta_{hk})$ of the subsequent sampling period has an interval intersection with $[\theta_{l0}, \theta_{h0})$. If there is no interval intersection, the interval inversion, namely an operation of shifting left or shifting right by $2\pi$, is performed on $[\theta_{lk}, \theta_{hk})$ through the interval scaler 1032 until the interval intersects with $[\theta_{l0}, \theta_{h0})$. If there is an interval intersection, the interval inversion is not performed on $[\theta_{lk}, \theta_{hk})$. Because there are phase operations of $\theta_{lk} = \varphi_{lk} - \Delta\theta_k$, $\theta_{hk} = \varphi_{hk} - \Delta\theta_{hk}$, where $\varphi_{lk}, \varphi_{hk} \in [0, 2\pi)$, $\Delta\theta_k \in [0, 2\pi)$, then $\theta_{lk}, \theta_{hk} \in [-2\pi, 2\pi)$. Therefore, the significance of standardization in the embodiment is to transfer $[\theta_{lk}, \theta_{hk})$ to the phase period in which the reference interval $[\theta_{l0}, \theta_{h0})$ falls, so as to compare and judge the upper and lower limits of the phase interval with the reference interval. As shown in FIG. 12, if the upper limit $\theta_{hk}$ of $[\theta_{lk}, \theta_{hk})$ is less than the lower limit $\theta_{l0}$ of $[\theta_{l0}, \theta_{h0})$, then $[\theta_{lk}, \theta_{hk})$ is shifted right by $2\pi$ to generate a new interval $[\theta'_{lk}, \theta'_{hk})$, and there is an interval intersection $[\theta_{l0}, \theta'_{hk})$ existing between $[\theta'_{lk}, \theta'_{hk})$ and $[\theta_{l0}, \theta_{h0})$, where $\theta'_{lk} = \theta_{lk} + 2\pi$ and $\theta'_{hk} = \theta_{hk} + 2\pi$. If the lower limit $\theta_{lk}$ of $[\theta_{lk}, \theta_{hk})$ is greater than the upper limit $\theta_{h0}$ of $[\theta_{l0}, \theta_{h0})$, then $[\theta_{lk}, \theta_{hk})$ is shifted left by $2\pi$ to generate a new interval $[\theta'_{lk}, \theta'_{hk})$, and there is an interval intersection $[\theta'_{lk}, \theta_{h0})$ existing between $[\theta'_{lk}, \theta'_{hk})$ and $[\theta_{l0}, \theta_{h0})$, where $\theta'_{lk} = \theta_{lk} - 2\pi$ and $\theta'_{hk} = \theta_{hk} - 2\pi$.

Figure 7:
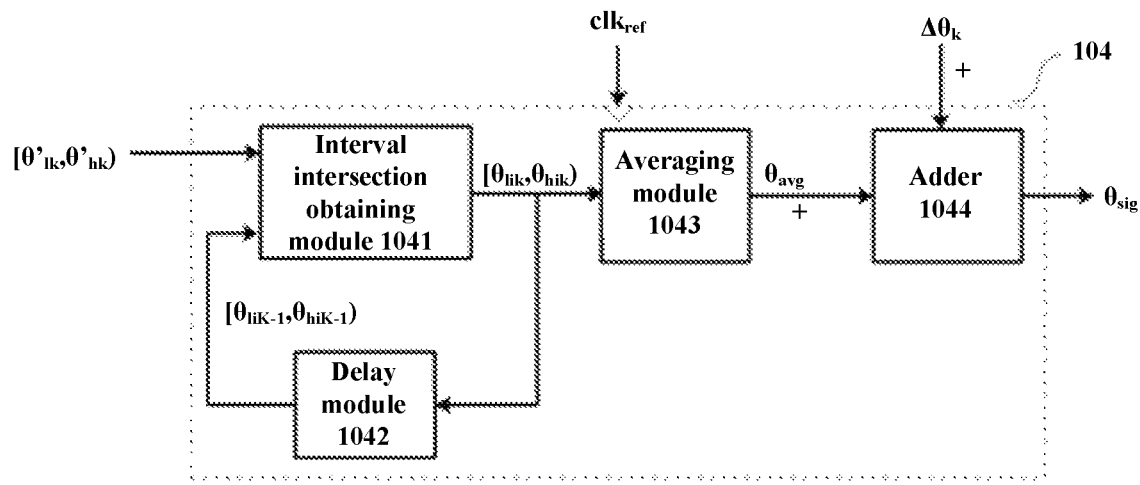
FIG. 7 is a schematic diagram of a phase interval converging module 104 according to an embodiment of the present disclosure.
Figure 13:
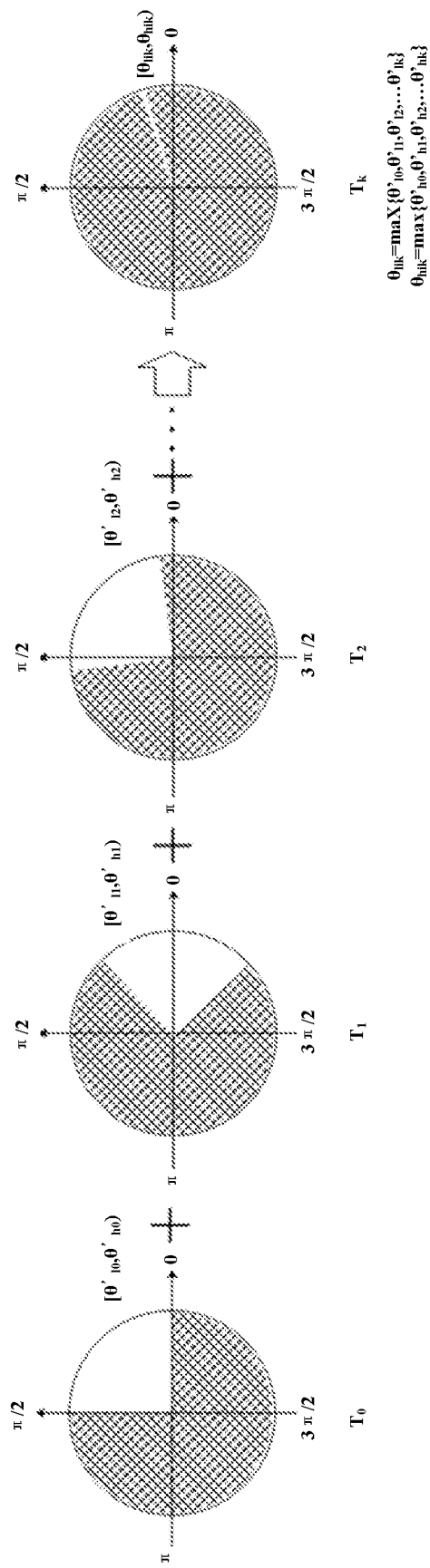
FIG. 13 is a functional schematic diagram of a phase interval converging module 104 according to an embodiment of the present disclosure.

FIG. 7 is a structure diagram of the phase interval converging module 104. As shown in FIG. 7, the module obtains intersection of $[\theta'_{lk}, \theta'_{hk})$ input in each sampling period to continuously reduce the range of interval. After a sufficient number of sampling periods k, the phase information of the clock signal to be detected at the initial sampling moment is converged by a mean calculation method, and the phase $\theta_{sig}$ of the clock signal to be detected in the current sampling period is calculated according to the phase difference $\Delta\theta_k$ of the clock signal to be detected relative to the sampling clock signal. The module may include an interval intersection obtaining module 1041, a delay module 1042, an averaging module 1043 and an adder 1044. The interval intersection obtaining module 1041 updates the intersection phase interval [$\theta_{lik}, \theta_{hik}$) of the current sampling period by comparing the upper and lower limits of the input phase interval [$\theta'_{lk}, \theta'_{hk}$) of the current sampling period and the intersection phase interval [$\theta_{lik-1}, \theta_{hik-1}$) of the previous sampling period. [$\theta_{lik-1}, \theta_{hik-1}$) is obtained by delaying a single sampling period through the delay module 1042. If $\theta'_{lk} < \theta_{lik-1}$ or $\theta'_{hk} < \theta_{hik-1}$, then $\theta_{lik} = \theta_{lik-1}$, $\theta_{hik} = \theta'_{hk}$; if $\theta'_{lk} \geq \theta_{lik-1}$ or $\theta'_{hk} \geq \theta_{hik-1}$, then $\theta_{lik} = \theta'_{lk}$, $\theta_{hik} = \theta_{hik-1}$, that is, [$\theta_{lik}, \theta_{hik}$)=[$\theta'_{lk}, \theta'_{hk}$)∩[$\theta_{lik-1}, \theta_{hik-1}$). As shown in FIG. 13, by continually obtaining the intersection of [$\theta'_{lk}, \theta'_{hk}$) of each sampling period, $\theta_{lik}$ will infinitely approach to $\theta_{hik}$ after a sufficient number of sampling periods, and then the initial phase $\theta_{avg}$ of the clock signal to be detected may be converged through the averaging module 1043, where $\theta_{avg} = (\theta_{lik}+\theta_{hik})/2$. $\theta_{avg}$ is added with the phase difference $\Delta\theta_k$ of the clock signal to be detected relative to the sampling clock signal through the adder 1044 to obtain the real-time phase $\theta_{sig}$ of the clock signal to be detected.

The solution is described below in combination with exemplary embodiments.

Exemplary Embodiment 1

Figure 14:
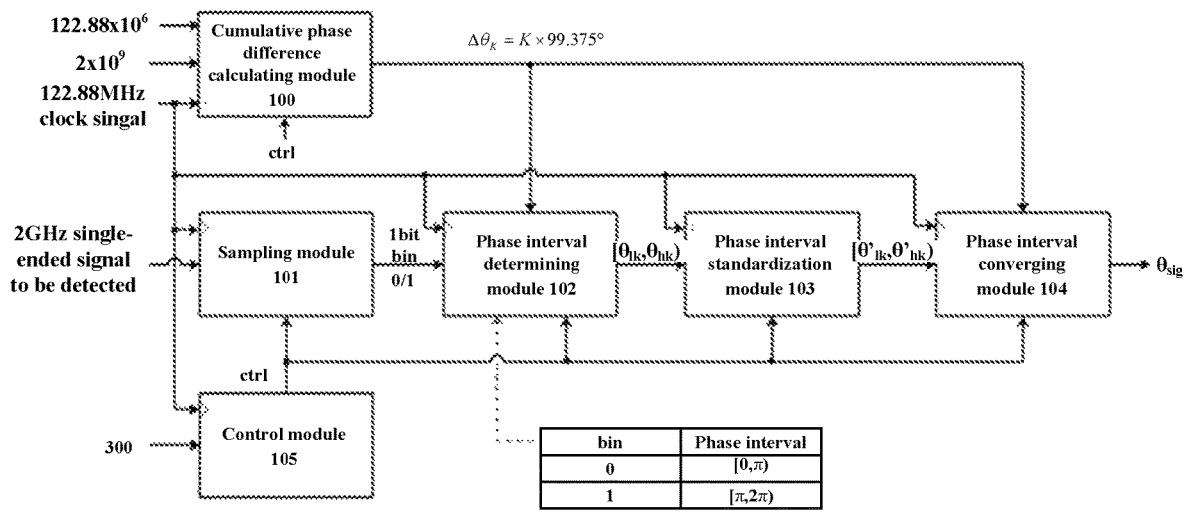
FIG. 14 is an exemplary diagram of detecting a single-ended clock phase according to an embodiment of the present disclosure.

The block diagram of the embodiment is shown in FIG. 14. The clock signal to be detected is a single-ended signal, and the frequency of the clock signal to be detected is set as 2 GHz, and the clock signal with a frequency of 122.88 MHz commonly used in the system is used for sampling. In the present exemplary embodiment, for the cumulative phase difference calculating module 100, $val_{ref}$ is configured as 122.88×10$^6$, and $val_{sig}$ is configured as 2×10$^9$, then the phase difference between the clock signal to be detected and the sampling clock signal in a single sampling period may be calculated as:

$\theta_T$=99.375°.

After k sampling periods, the cumulative phase difference between the clock signal to be detected and the sampling clock signal is:

$\Delta\theta_K$=K×99.375°.

When the clock signal to be detected is a single-ended signal, bin output by the sampling module 101 in each sampling period is data of 1 bit, and the phase interval determination condition of the phase interval determining module 102 is shown in Table 1.

TABLE 1

Phase interval determination condition of exemplary embodiment 1

| bin | Phase interval |
| --- | --- |
| 0 | [0, π) |
| 1 | [π, 2π) |

Figure 18:
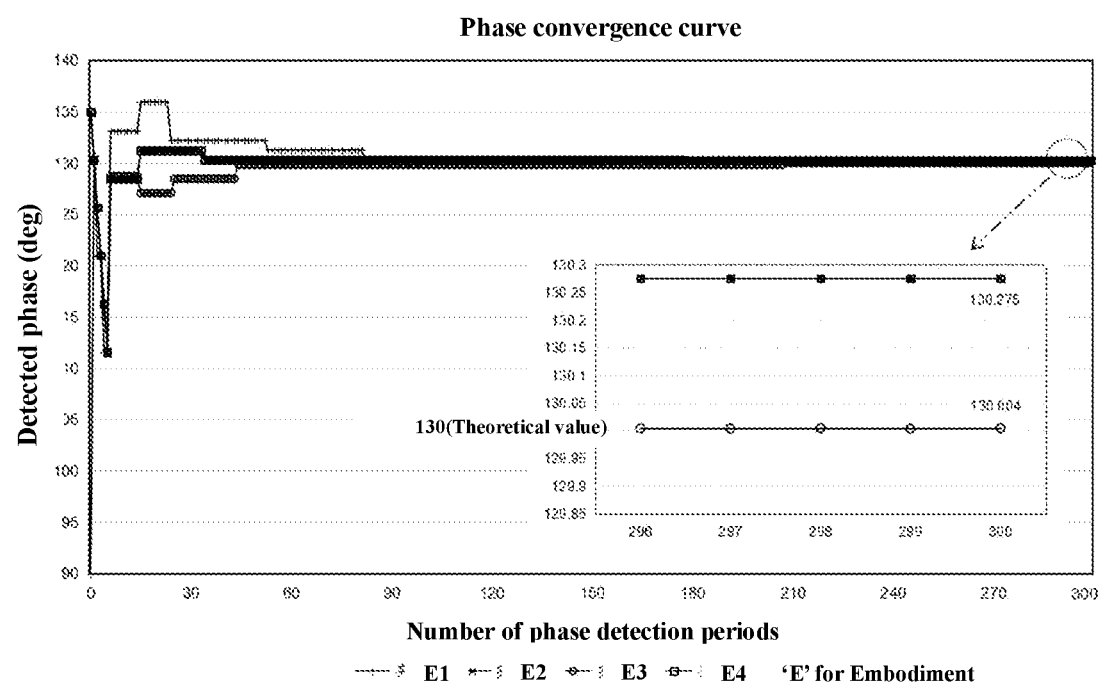
FIG. 18 is a phase convergence curve according to an embodiment of the present disclosure.

The phase of the clock signal to be detected at the initial sampling moment is set as 130°, and the number of sampling periods $val_{sum}$ of the module 105 is set as 300. As shown in the phase convergence curve in FIG. 18, at the end of the sampling, the initial phase $\theta_{avg}$ of the clock signal to be detected is converged to 130.275°, and the phase detection error is 0.275°.

Exemplary Embodiment 2

Figure 15:
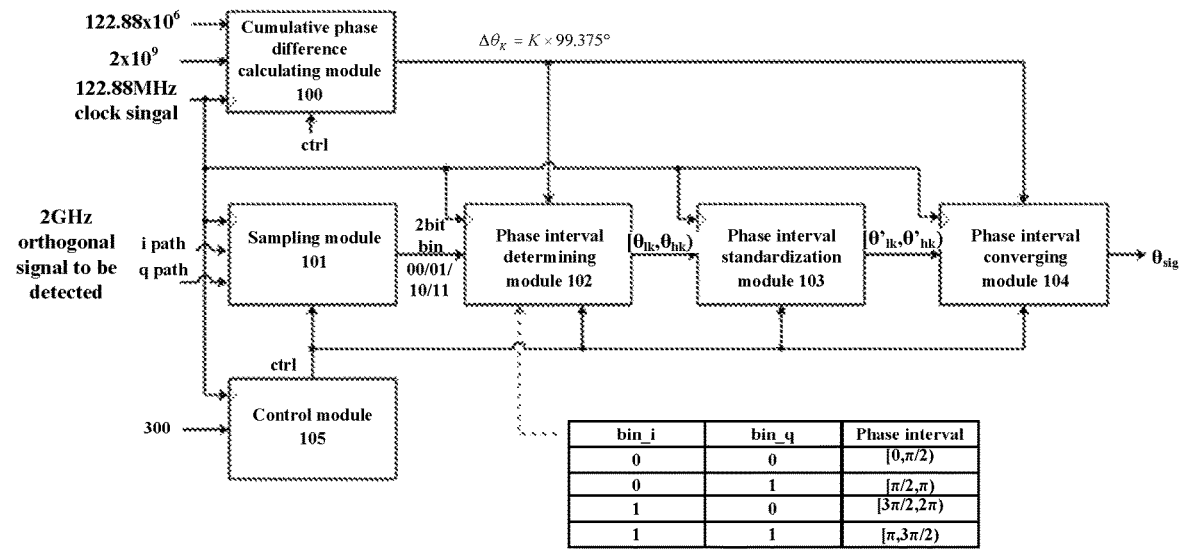
FIG. 15 is an exemplary diagram of detecting an orthogonal clock phase according to an embodiment of the present disclosure.

The block diagram of the embodiment is shown in FIG. 15. The clock signal to be detected is an orthogonal signal, the frequency of the clock signal to be detected is set as 2 GHz, and the clock signal with a frequency of 122.88 MHz commonly used in the system is used for sampling. In the exemplary embodiment, for the cumulative phase difference calculating module 100, $val_{ref}$ is configured as 122.88×10$^6$, and $val_{sig}$ is configured as 2×10$^9$, then the phase difference between the clock signal to be detected and the sampling clock signal in a single sampling period may be calculated as:

$\theta_T$=99.375°.

After k sampling periods, the cumulative phase difference between the clock signal to be detected and the sampling clock signal is:

$\Delta\theta_K$=K×99.375°.

When the clock signal to be detected is an orthogonal signal, bin output by the sampling module 101 in each sampling period is 2 bit of data, and the phase interval determination condition of the phase interval determining module 102 is shown in Table 2.

TABLE 2

Phase interval determination condition of exemplary embodiment 2

| bin_i | bin_q | Phase interval |
| --- | --- | --- |
| 0 | 0 | [0, π/2) |
| 0 | 1 | [π/2, π) |
| 1 | 0 | [3π/2, 2π) |
| 1 | 1 | [π, 3π/2) |

The phase of the clock signal to be detected at the initial sampling moment is set as 130°, and the number of sampling periods $val_{sum}$ of the module 105 is set as 300. As shown in the phase convergence curve in FIG. 18, at the end of the sampling, the initial phase $\theta_{avg}$ of the clock signal to be detected is converged to 130.275°, and the phase detection error is 0.275°.

Exemplary Embodiment 3

Figure 16:
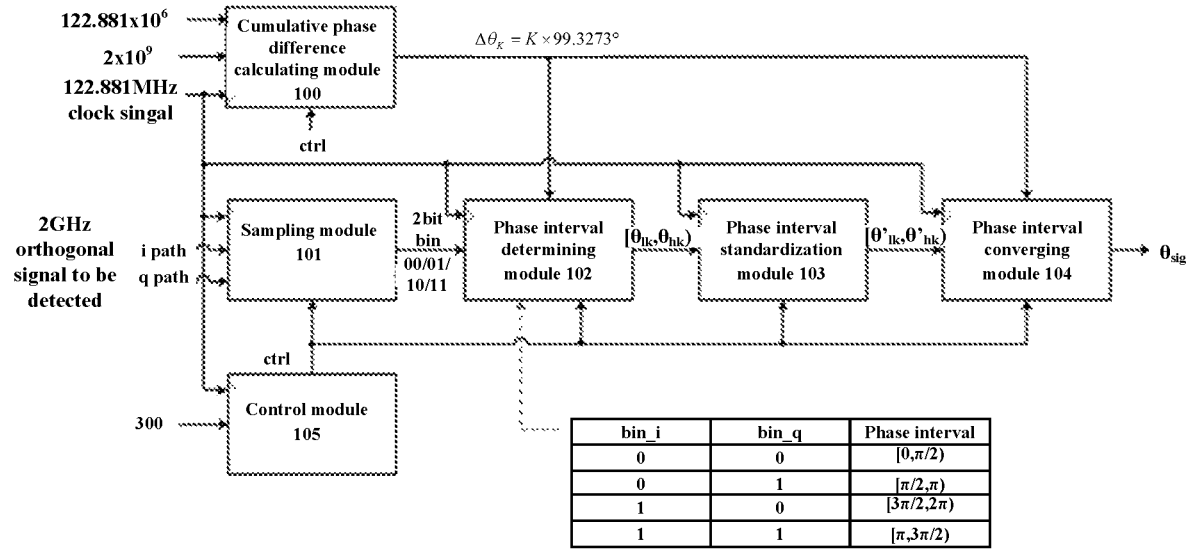
FIG. 16 is an exemplary diagram of a high-precision phase detection mode according to an embodiment of the present disclosure.

The mode is dedicated to improving the phase detection precision of the scheme in the embodiments of the present disclosure. For the sampling module 101, if the lowest common multiple of the frequency of the clock signal to be detected and the frequency of the sampling clock signal is small, that is, there are smaller integers m and n making m×$val_{sig}$=n×$val_{ref}$, then binary data output by the sampling module 101 will enter a periodic cycle after n sampling periods, that is, the maximum sampling diversity will be achieved in n sampling periods. The block diagram of the embodiment is shown in FIG. 16. The clock signal to be detected is an orthogonal signal, and the frequency of the clock signal to be detected is set as 2 GHz. In order to improve the phase detection precision, the clock signal of 122.881 MHz is used for sampling. In the exemplary embodiment, for the cumulative phase difference calculating module 100, $val_{ref}$ is configured as $122.881 \times 10^6$, and $val_{sig}$ is configured as $2 \times 10^9$, then the phase difference between the clock signal to be detected and the sampling clock signal in a single sampling period may be calculated as:

$$\theta_T = 99.3273°.$$

After k sampling periods, the cumulative phase difference between the clock signal to be detected and the sampling clock signal is:

$$\Delta\theta_K = K \times 99.3273°.$$

When the clock signal to be detected is an orthogonal signal, bin output by the sampling module 101 in each sampling period is data of 2 bits, and the phase interval determination condition of the phase interval determining module 102 is shown in Table 3.

TABLE 3

Phase interval determination condition of exemplary embodiment 3

| bin_i | bin_q | Phase interval |
|---|---|---|
| 0 | 0 | [0, π/2) |
| 0 | 1 | [π/2, π) |
| 1 | 0 | [3π/2, 2π) |
| 1 | 1 | [π, 3π/2) |

The phase of the clock signal to be detected at the initial sampling moment is set as 130°, and the number of sampling periods $val_{sum}$ of the module 105 is set as 300. As shown in the phase convergence curve in FIG. 18, at the end of the sampling, the initial phase $\theta_{avg}$ of the clock signal to be detected is converged to 130.004°, and the phase detection error is 0.004°.

Exemplary Embodiment 4

Figure 17:
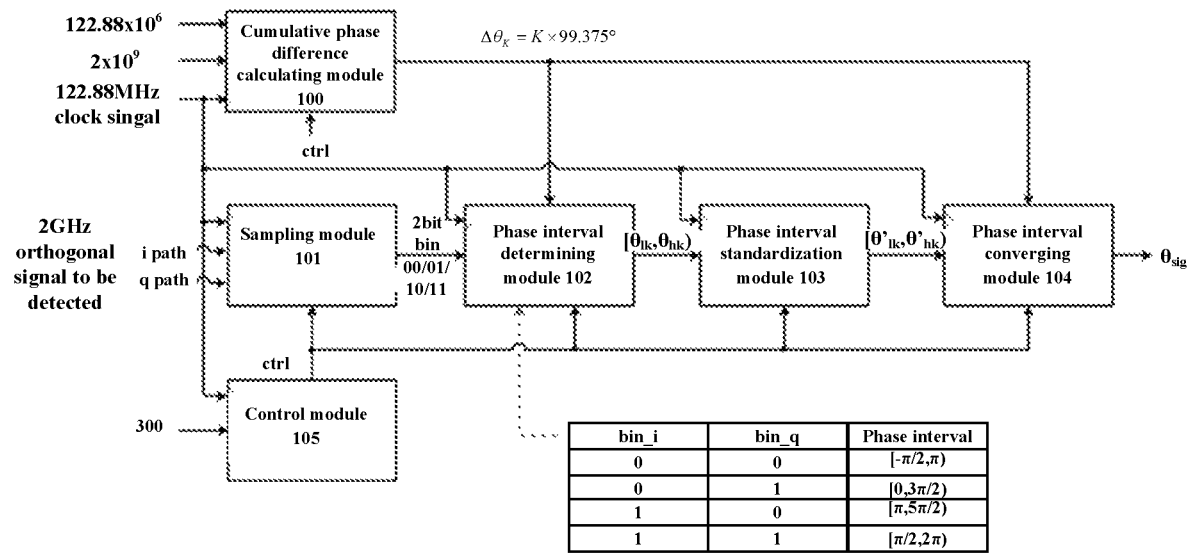
FIG. 17 is an exemplary diagram of a high-reliability phase detection mode according to an embodiment of the present disclosure.

The mode is dedicated to solving the sampling error that may occur when a sampling circuit 101 samples near the zero crossing position of the clock signal to be detected. The block diagram of the embodiment is shown in FIG. 17. The clock signal to be detected is an orthogonal signal, the frequency of the clock signal to be detected is set as 2 GHz, and the clock signal with a frequency of 122.88 MHz commonly used in the system is used for sampling. In the exemplary embodiment, for the cumulative phase difference calculating module 100, $val_{ref}$ is configured as $122.88 \times 10^6$, and $val_{sig}$ is configured as $2 \times 10^9$, then the phase difference between the clock signal to be detected and the sampling clock signal in a single sampling period may be calculated as:

$$\theta_T = 99.375°.$$

After k sampling periods, the cumulative phase difference between the clock signal to be detected and the sampling clock signal is:

$$\Delta\theta_K = K \times 99.375°.$$

When the clock signal to be detected is an orthogonal signal, bin output by the sampling module 101 in each sampling period is data of 2 bit, and the phase interval determination condition of the phase interval determining module 102 is shown in Table 4. In order to improve the reliability, the range of the determined phase interval is amplified here.

TABLE 4

Phase interval determination condition of exemplary embodiment 4

| bin_i | bin_q | Phase interval |
|---|---|---|
| 0 | 0 | [−π/2, π) |
| 0 | 1 | [0, 3π/2) |
| 1 | 0 | [π, 5π/2) |
| 1 | 1 | [π/2, π) |

The phase of the clock signal to be detected at the initial sampling moment is set as 130°, and the number of sampling periods $val_{sum}$ of the module 105 is set as 300. As shown in the phase convergence curve in FIG. 18, at the end of the sampling, the initial phase $\theta_{avg}$ of the clock signal to be detected is converged to 130.275°, and the phase detection error is 0.275°.

It is to be noted that each of the above modules may be implemented by software or hardware. For the latter, the modules may be implemented by, but not limited to, either of the following manners: the above modules are all located in the same processor; or, the above modules are located in different processors in any combination form respectively.

The embodiment of the present disclosure also provides a storage medium. The storage medium stores a computer program. The computer program is configured to perform, at runtime, operations in any of the above method embodiments.

In some exemplary implementations of the embodiment, the storage media include, but not limited to, a USB flash disk, a ROM, a RAM, a mobile hard disk, a magnetic disk, a compact disc, and other media capable of storing the computer program.

The embodiment of the present disclosure also provides an electronic apparatus, which includes a memory and a processor. The memory stores a computer program. The processor is configured to run the computer program to perform operations in any of the above method embodiments.

In some exemplary implementations of the embodiment, the electronic apparatus may also include a transmission device and an input/output device. The transmission device is connected with the processor, and the input/output device is connected with the processor.

In an exemplary embodiment, the specific examples in the present embodiment may refer to the examples described in the above embodiments and alternative embodiments.

Compared with the conventional art, the scheme in the embodiments of the present disclosure may reduce the design difficulty of the sampling circuit and the operating frequency of the post-stage digital circuit by undersampling, thus improving the reliability of circuit. Secondly, the embodiments of the present disclosure may realize inversion or standardization of the phase through a simple logical operation without using the NCO circuit and the arctangent circuit with complex structure, so the algorithm is simple, and the design difficulty of the digital circuit is reduced. Moreover, the embodiments of the present disclosure have high compatibility of algorithm and supports differential, single-ended or orthogonal sampling modes. In addition, the embodiments of the present disclosure may improve the phase detection precision by increasing the number of sampling periods or reducing the correlation between the frequency of the sampling clock and the frequency of the clock to be detected. Besides, the embodiments of the present disclosure only involve rough sampling of the clock to be detected, but do not extract the amplitude information of the clock to be detected, so even for the signal to be detected with a high frequency, the phase detection scheme in the embodiments of the present disclosure can still achieve high reliability. Finally, except for the sampling circuit, all the other circuits in the embodiments of the present disclosure are digital circuits, and the sampling circuit may also be realized in a digital form, that is, a TSPC trigger. Therefore, the whole circuit scheme is not sensitive to Process Voltage Temperature (PVT) changes, and then high robustness may be achieved.

It is apparent that a person skilled in the art shall understand that all of the above-mentioned modules or operations in the present disclosure may be implemented by using a general computation apparatus, may be centralized on a single computation apparatus or may be distributed on a network composed of multiple computation apparatuses. Optionally, they may be implemented by using executable program codes of the computation apparatuses. Thus, they may be stored in a storage apparatus and executed by the computation apparatuses, the shown or described operations may be executed in a sequence different from this sequence under certain conditions, or they are manufactured into each integrated circuit module respectively, or multiple modules or operations therein are manufactured into a single integrated circuit module. Thus, the embodiments of the present disclosure are not limited to any specific hardware and software combination.

The above is only the exemplary embodiments of the present disclosure, not intended to limit the present disclosure. As will occur to those having ordinary skill in the art, the present disclosure is susceptible to various modifications and changes. Any modifications, equivalent replacements, improvements and the like made within the principle of the present disclosure shall fall within the scope of protection of the present disclosure.

INDUSTRIAL APPLICABILITY

As mentioned above, a phase detection method and apparatus, a storage medium and an electronic apparatus provided in the embodiments of the present disclosure have the following beneficial effects: the phase detection algorithm is simple, the circuit realization difficulty is low, the phase convergence speed is fast, and the phase detection precision is high.

What is claimed is:

1. A phase detection method performed by a phase detection apparatus, the method comprising:
performing a sampling operation on a clock signal to be detected to obtain binary sequences;
determining, according to the binary sequences, phase intervals of the clock signal to be detected in initial sampling periods as first phase intervals;
performing, based on a reference phase interval in the first phase intervals, a standardization operation on other phase intervals in the first phase intervals to obtain second phase intervals, wherein the reference phase interval is a phase interval determined within a first sampling period after the sampling operation is triggered, and the other phase intervals are phase intervals determined within sampling periods following the first sampling period after the sampling operation is triggered; and
converging the second phase intervals, and obtaining, according to the converged second phase intervals, phase information of the clock signal to be detected.

2. The method according to claim 1, wherein performing the sampling operation on the clock signal to be detected to obtain the binary sequences comprises:
performing, based on a sampling clock signal, the sampling operation on the clock signal to be detected to obtain the binary sequences, wherein a lowest common multiple of a frequency of the sampling clock signal and a frequency of the clock signal to be detected exceeds a predetermined threshold.

3. The method according to claim 1, wherein determining, according to the binary sequences, the phase intervals of the clock signal to be detected in the initial sampling periods as the first phase intervals comprises:
determining, according to the binary sequences, the phase intervals of the clock signal to be detected at respective rising edges of the sampling clock signal; and
determining, according to the determined phase intervals and cumulative phase differences of the clock signal to be detected relative to the sampling clock signal, intervals of the clock signal to be detected at initial sampling moments as the first phase intervals, wherein the sampling clock signal is used for performing the sampling operation on the clock signal to be detected.

4. The method according to claim 3, wherein determining, according to the binary sequences, the phase intervals of the clock signal to be detected at the respective rising edges of the sampling clock signal comprises:
determining a phase interval determination condition corresponding to a type of the binary sequences; and
determining the phase intervals of the clock signal to be detected at the respective rising edges of the sampling clock signal according to the binary sequences and the phase interval determination condition.

5. The method according to claim 4, wherein the type of the binary sequences comprises at least one of:
a differential type, a single-ended type, and an orthogonal type.

6. The method according to claim 1, wherein performing, based on the reference phase interval in the first phase intervals, the standardization operation on the other phase intervals in the first phase intervals to obtain the second phase intervals comprises:
using the reference phase interval as a standard, transferring the other phase intervals to a phase period in which the reference phase interval falls to obtain the second phase intervals.

7. The method according to claim 6, wherein using the reference phase interval as the standard, transferring the other phase intervals to the phase period in which the reference phase interval falls to obtain the second phase intervals comprises:
in a case of determining that there is no intersection between the other phase intervals and the reference phase interval, repeatedly inversing the other phase intervals until the other phase intervals intersect with the reference phase interval, and determining the reference phase interval and the other phase intervals after the inversion as the second phase intervals.

8. The method according to claim 7, wherein the inversion comprises shifting left by $2\pi$ or shifting right by $2\pi$.

9. The method according to claim 7, wherein
after performing, based on the reference phase interval in the first phase intervals, the standardization operation on the other phase intervals in the first phase intervals to obtain the second phase intervals, the method further comprises:

obtaining an intersection of the second phase intervals in a current sampling period in turn until a difference between an upper limit and a lower limit of the intersection of the second phase intervals in the current sampling period is less than a predetermined value, wherein the intersection of the second phase intervals in the current sampling period is obtained by intersecting a phase interval, which corresponds to the current sampling period, among the second phase intervals with the intersection of the second phase intervals in a previous sampling period;

converging the second phase intervals, and obtaining, according to the converged second phase intervals, the phase information of the clock signal to be detected comprises:

obtaining an initial phase of the clock signal to be detected at an initial sampling moment by averaging the upper limit and the lower limit, the difference between which is less than the predetermined value; obtaining a phase of the clock signal to be detected in the current sampling period by summing the initial phase and a phase difference, wherein the phase difference is a cumulative phase difference, for the current sampling period, of the clock signal to be detected relative to the sampling clock signal, and the cumulative phase difference is calculated according to a relationship between a frequency of the clock signal to be detected and a frequency of the sampling clock signal used for performing the sampling operation.

10. The method according to claim 1, wherein after determining, according to the binary sequences, the phase intervals of the clock signal to be detected in the initial sampling periods as the first phase intervals, the method further comprises:

in a case of determining that there is an intersection between the other phase intervals and the reference phase interval, directly converging the first phase intervals without performing the standardization operation on the other phase intervals, and obtaining the phase information of the clock signal to be detected according to the converged first phase intervals.

11. A phase detection apparatus, comprising the following circuit modules:

a sampling module, configured to perform a sampling operation on a clock signal to be detected to obtain binary sequences;

a phase interval determining module, configured to determine, according to the binary sequences, phase intervals of the clock signal to be detected in initial sampling periods as first phase intervals;

a standardization module, configured to perform, based on a reference phase interval in the first phase intervals, a standardization operation on other phase intervals in the first phase intervals to obtain second phase intervals, wherein the reference phase interval is a phase interval determined within a first sampling period after the sampling operation is triggered, and the other phase intervals are phase intervals determined within sampling periods following the first sampling period after the sampling operation is triggered; and a phase interval converging module, configured to converge the second phase intervals, and obtain, according to the converged second phase intervals, phase information of the clock signal to be detected.

12. The apparatus according to claim 11, wherein the sampling module comprises:

a sampler, configured to perform, based on a sampling clock signal, the sampling operation on the clock signal to be detected to obtain the binary sequences, wherein a lowest common multiple of a frequency of the sampling clock signal and a frequency of the clock signal to be detected exceeds a predetermined threshold.

13. The apparatus according to claim 11, wherein the phase interval determining module comprises:

a phase interval determiner, configured to determine, according to the binary sequences, the phase intervals of the clock signal to be detected at respective rising edges of the sampling clock signal; and an adder, configured to determine, according to the determined phase intervals and cumulative phase differences of the clock signal to be detected relative to the sampling clock signal, intervals of the clock signal to be detected at initial sampling moments as the first phase intervals, wherein the sampling clock signal is used for performing the sampling operation on the clock signal to be detected.

14. The apparatus according to claim 13, wherein the phase interval determiner is configured to:

determine a phase interval determination condition corresponding to a type of the binary sequences; and determine the phase intervals of the clock signal to be detected at the respective rising edges of the sampling clock signal according to the binary sequences and the phase interval determination condition.

15. The apparatus according to claim 14, wherein the type of the binary sequences comprises at least one of:

a differential type, a single-ended type, and an orthogonal type.

16. The apparatus according to claim 11, wherein the standardization module is configured to:

transfer, by using the reference phase interval as the standard, the other phase intervals to a phase period in which the reference phase interval falls to obtain the second phase intervals.

17. The apparatus according to claim 16, wherein the standardization module comprises:

a phase scaler, configured to, in a case of determining that there is no intersection between the other phase intervals and the reference phase interval, repeatedly inverse the other phase intervals until the other phase intervals intersect with the reference phase interval, and determine the reference phase interval and the other phase intervals after the inversion as the second phase intervals.

18. The apparatus according to claim 17, wherein the inversion comprises shifting left by $2\pi$ or shifting right by $2\pi$.

19. The apparatus according to claim 17, wherein the phase interval converging module comprises:

an interval intersection obtaining module, configured to, after the standardization module performs, based on the reference phase interval in the first phase intervals, the standardization operation on the other phase intervals in the first phase intervals to obtain the second phase intervals, obtain an intersection of the second phase intervals in a current sampling period in turn until a difference between an upper limit and a lower limit of the intersection of the second phase intervals in the current sampling period is less than a predetermined value, wherein the intersection of the second phase intervals in the current sampling period is obtained by intersecting a phase interval, which corresponds to the current sampling period, among the second phase intervals with the intersection of the second phase intervals in a previous sampling period;

an averaging module, configured to obtain an initial phase of the clock signal to be detected at an initial sampling moment by averaging the upper limit and the lower limit, the difference between which is less than the predetermined value; and an adder, configured to obtain a phase of the clock signal to be detected in the current sampling period by summing the initial phase and a phase difference, wherein the phase difference is a cumulative phase difference, for the current sampling period, of the clock signal to be detected relative to the sampling clock signal, and the cumulative phase difference is calculated according to a relationship between a frequency of the clock signal to be detected and a frequency of the sampling clock signal used for performing the sampling operation.

20. The apparatus according to claim 11, wherein the apparatus is further configured to:

after the phase interval determining module determines, according to the binary sequences, the phase intervals of the clock signal to be detected in the initial sampling periods as the first phase intervals, and in a case of determining that there is an intersection between the other phase intervals and the reference phase interval, directly converge the first phase intervals without performing the standardization operation on the other phase intervals, and obtain the phase information of the clock signal to be detected according to the converged first phase intervals.

* * * * *